US009698344B2

(12) United States Patent
Kau

(10) Patent No.: US 9,698,344 B2
(45) Date of Patent: Jul. 4, 2017

(54) DIELECTRIC THIN FILM ON ELECTRODES FOR RESISTANCE CHANGE MEMORY DEVICES

(71) Applicant: INTEL CORPORATION, Santa Clara, CA (US)

(72) Inventor: DerChang Kau, Cupertino, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/013,517

(22) Filed: Feb. 2, 2016

(65) Prior Publication Data

US 2016/0149127 A1 May 26, 2016

Related U.S. Application Data

(62) Division of application No. 13/993,302, filed as application No. PCT/US2011/051600 on Sep. 14, 2011, now Pat. No. 9,287,498.

(51) Int. Cl.
*H01L 47/00* (2006.01)
*H01L 21/06* (2006.01)
(Continued)

(52) U.S. Cl.
CPC .......... *H01L 45/06* (2013.01); *H01L 27/2427* (2013.01); *H01L 45/12* (2013.01);
(Continued)

(58) Field of Classification Search
CPC ... H01L 45/1253; H01L 45/141; H01L 45/16; H01L 27/2427; H01L 45/06; H01L 45/12; H01L 45/1233; H01L 45/1293
(Continued)

(56) References Cited

U.S. PATENT DOCUMENTS 7,332,735 B2   2/2008   Campbell et al.
7,359,231 B2   4/2008   Venkataraman et al.
(Continued)

FOREIGN PATENT DOCUMENTS

CN       1841558 A    10/2006
CN     101443914 A     5/2009
(Continued)

OTHER PUBLICATIONS

Japanese Office Action for Japanese Application No. 2012-536823, dated Jul. 16, 2013, 4 pages.
(Continued)

*Primary Examiner* — Dzung Tran
(74) *Attorney, Agent, or Firm* — Schwabe Williamson & Wyatt PC

(57) ABSTRACT

Embodiments of the present disclosure describe techniques and configurations for increasing thermal insulation in a resistance change memory device, also known as a phase change memory (PCM) device. In one embodiment, an apparatus includes a storage structure of a PCM device, the storage structure having a chalcogenide material, an electrode having an electrically conductive material, the electrode having a first surface that is directly coupled with the storage structure, and a dielectric film having a dielectric material, the dielectric film being directly coupled with a second surface of the electrode that is disposed opposite to the first surface. Other embodiments may be described and/or claimed.

8 Claims, 6 Drawing Sheets

(51) Int. Cl.
  *H01L 21/20* (2006.01)
  *H01L 21/00* (2006.01)
  *H01L 45/00* (2006.01)
  *H01L 27/24* (2006.01)

(52) U.S. Cl.
  CPC ...... *H01L 45/1233* (2013.01); *H01L 45/1253* (2013.01); *H01L 45/1293* (2013.01); *H01L 45/141* (2013.01); *H01L 45/16* (2013.01)

(58) Field of Classification Search
  USPC .............................................. 257/4; 438/382
  See application file for complete search history.

(56) References Cited

U.S. PATENT DOCUMENTS

| | | | |
|---|---|---|---|
| 7,502,277 | B2 | 3/2009 | Wu et al. |
| 7,560,721 | B1 | 7/2009 | Breitwisch et al. |
| 7,804,083 | B2 | 9/2010 | Chen |
| 2003/0123284 | A1 | 7/2003 | Lowrey et al. |
| 2004/0037179 | A1 | 2/2004 | Lee |
| 2004/0113137 | A1 | 6/2004 | Lowrey |
| 2004/0184331 | A1 | 9/2004 | Hanzawa et al. |
| 2005/0041461 | A1 | 2/2005 | Hirabayashi |
| 2005/0180188 | A1 | 8/2005 | Bedeschi et al. |
| 2005/0275106 | A1* | 12/2005 | Fricke ............... H01L 29/88 257/758 |
| 2006/0002172 | A1 | 1/2006 | Venkataraman et al. |
| 2006/0073652 | A1 | 4/2006 | Pellizzer et al. |
| 2006/0215435 | A1 | 9/2006 | Jeong et al. |
| 2006/0227591 | A1 | 10/2006 | Lowrey et al. |
| 2006/0227592 | A1 | 10/2006 | Parkinson et al. |
| 2006/0249753 | A1* | 11/2006 | Herner ............... H01L 27/1021 257/202 |
| 2007/0041245 | A1 | 2/2007 | Ahn |
| 2007/0069276 | A1* | 3/2007 | Scheuerlein ........ G11C 11/5692 257/314 |
| 2007/0206410 | A1 | 9/2007 | Sutardja |
| 2007/0240995 | A1* | 10/2007 | Odagawa ........... G11C 13/0007 205/183 |
| 2007/0285970 | A1* | 12/2007 | Toda ............... G11C 8/08 365/148 |
| 2008/0116440 | A1 | 5/2008 | Ho et al. |
| 2008/0273363 | A1 | 11/2008 | Mouli |
| 2008/0273371 | A1 | 11/2008 | Philipp et al. |
| 2009/0010050 | A1 | 1/2009 | Sutardja |
| 2009/0034325 | A1 | 2/2009 | Lowrey et al. |
| 2009/0080242 | A1 | 3/2009 | Resta et al. |
| 2009/0114898 | A1 | 5/2009 | Ricker |
| 2009/0231912 | A1 | 9/2009 | Liu |
| 2010/0177560 | A1 | 7/2010 | McElheny et al. |
| 2010/0254178 | A1 | 10/2010 | Tsushima et al. |
| 2011/0103139 | A1 | 5/2011 | Kau et al. |

FOREIGN PATENT DOCUMENTS

| | | |
|---|---|---|
| JP | 2003-229538 A | 8/2003 |
| JP | 2005-051122 A | 2/2005 |
| JP | 2006-352082 A | 12/2006 |
| JP | 2008004715 A | 1/2008 |
| JP | 2009-508346 A | 2/2009 |
| JP | 201128799 A | 2/2011 |
| KR | 100781550 B1 | 12/2007 |
| KR | 1020090123244 A | 12/2009 |
| KR | 1020090126587 A | 12/2009 |
| KR | 20110060978 A | 6/2011 |
| TW | 200410404 A | 6/2004 |
| TW | 200901377 A | 1/2009 |
| TW | 200952228 A | 12/2009 |
| WO | 2010/140210 A1 | 12/2010 |

OTHER PUBLICATIONS

Korean Office Action for Korean Application No. 10-2012-7013876, dated Jul. 9, 2013, 9 pages.
International Preliminary Report for PCT Application No. PCT/US2010/050137, dated May 10, 2012, 2 pages.
International Search Report and Written Opinion for PCT Application No. PCT/US2010/050137, dated May 13, 2011, 5 pages.
International Preliminary Report on Patentability for PCT Application No. PCT/US2010/052833, dated Jun. 21, 2012, 6 pages.
CN Office Action for Chinese Application No. 201010584054.9, dated Feb. 5, 2013, 16 pages.
CN Office Action for Chinese Application No. 201010584054.9, dated Oct. 13, 2013, 6 pages.
CN Office Action for Chinese Application No. 2010800563119, dated Dec. 3, 2013, 18 pages.
KR Office Action for Korean Application No. 1020127014674, dated Jul. 23, 2013, 7 pages.
International Search Report and Written Opinion for PCT Application No. PCT/US2010/052833, dated Jul. 1, 2011, 9 pages.
CN Office Action for Chinese Application No. 201080059000.9, dated Nov. 29, 2010, 35 pages.
KR Preliminary Rejection for Korean Application No. 2012-7019353, dated Aug. 16, 2013, 4 pages.
International Search Report and Written Opinion for PCT Application No. PCT/US2010/058233, dated Nov. 29, 2010, 10 pages.
International Search Report and Written Opinion for PCT Application No. PCT/US2011/053171, dated Feb. 28, 2012, 7 pages.
International Preliminary Report for PCT Application No. PCT/US2011/053171, dated Apr. 4, 2013, 6 pages.
International Preliminary Report for PCT Application No. PCT/US2012/026121, dated Oct. 3, 2013, 7 pages.
International Search Report and Written Opinion for PCT Application No. PCT/US2012/026121, dated Sep. 26, 2012, 10 pages.
International Preliminary Report for PCT Application No. PCT/US2012/042877, dated Jan. 9, 2014, 6 pages.
International Search Report and Written Opinion for PCT Application No. PCT/2012/042877, dated Mar. 21, 2013, 9 pages.
David L. Kencke, et al, "The Role of Interfaces in Damascene Phase-Change Memory," IEEE 2007, 4 pages.
International Search Report and Written Opinion mailed May 1, 2012 from International Application No. PCT/US2011/051600.
Office Action issued Sep. 2, 2014 from Taiwanese Patent Application No. 101132362.
Office Action issued Jan. 19, 2015 from Korean Patent Application No. 10-2014-7006805.
Office Action mailed Mar. 10, 2015, issued in corresponding Japanese Patent Application No. 2014-530638, 5 pages.
Notice of Final Rejection without English Translation mailed Apr. 21, 2015, issued in corresponding Korean Patent Application No. 10-2014-7006805, 6 pages.
Notice of Reasons for Rejection mailed Jun. 23, 2015, issued in corresponding Japanese Patent Application No. 2014-530638, 9 pages.
Notice of 2nd Final Rejection mailed Jul. 31, 2015, issued in corresponding Korean Patent Application No. 10-2014-7006805, 5 pages.

* cited by examiner

DIELECTRIC THIN FILM ON ELECTRODES FOR RESISTANCE CHANGE MEMORY DEVICES

CROSS REFERENCE TO RELATED APPLICATIONS

The present application is a division of U.S. patent application Ser. No. 13/993,302, filed Jun. 11, 2013, which is a national phase entry under 35 U.S.C. §371 of International Application No. PCT/US2011/051600, filed Sep. 14, 2011, entitled "DIELECTRIC THIN FILM ON ELECTRODES FOR RESISTANCE CHANGE MEMORY DEVICES," and the entire contents and disclosures of which are hereby incorporated by reference in their entireties and all purposes.

FIELD

Embodiments of the present disclosure generally relate to the field of integrated circuits, and more particularly, to techniques and configurations for increasing thermal insulation in a resistance change memory device, also known as a phase change memory (PCM) device.

BACKGROUND

Presently, a phase change memory (PCM) device may include one or more memory cells disposed between a word-line and a bit-line. The one or more memory cells may include electrically conductive materials that couple a chalcogenide material to the word-line and the bit-line. Generally, the electrically conductive materials do not provide thermal insulation for heat generated in the PCM device, which may degrade a write efficiency of the PCM device. For example, when heat generated in the chalcogenide material is allowed to propagate through the electrically conductive materials, a greater programming current may need to be used to program the PCM device, resulting in reduced write efficiency in the PCM device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations for increasing thermal insulation in a resistance change memory device, also known as a phase change memory (PCM) device. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
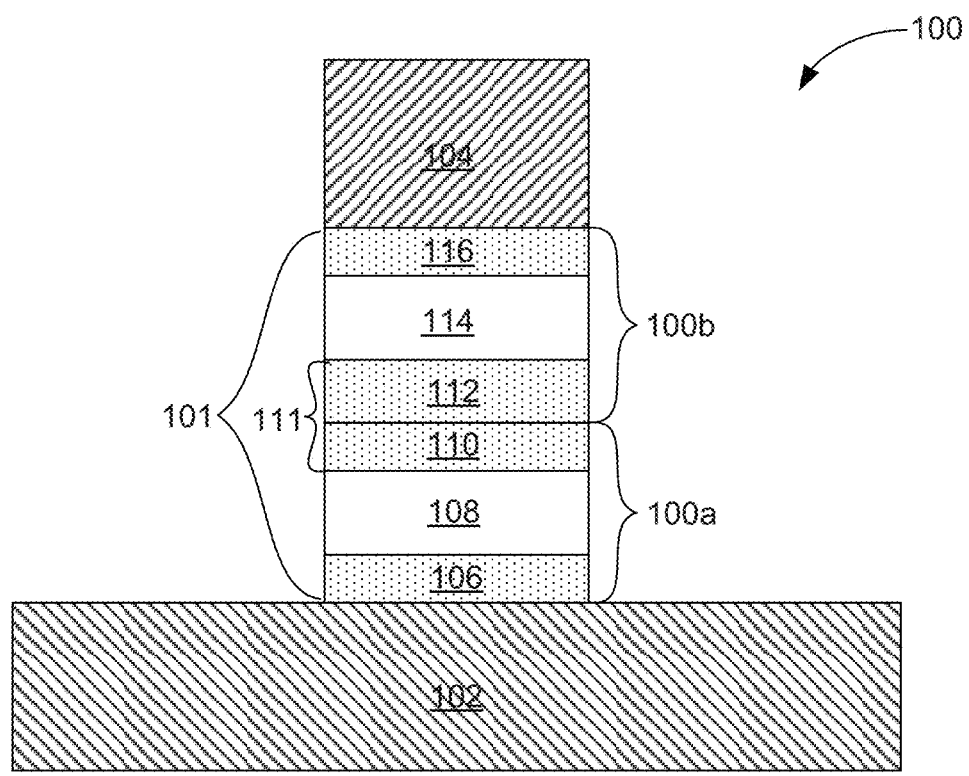
FIG. 1 schematically illustrates an example cross-section of a phase change memory (PCM) device in accordance with some embodiments.

FIG. 1 schematically illustrates an example cross-section of a phase change memory (PCM) device 100 in accordance with some embodiments. The PCM device 100 includes a cell 101 disposed between a word-line 102 (also known as "row interconnect") and a bit-line 104 (also known as "column interconnect") at an intersection of the word-line 102 and the bit-line 104. For example, in the depicted embodiment, the word-line 102 extends in a direction from left to right across the page and the bit-line 104 extends in a direction in and out of the page. The PCM device 100 may include multiple word-lines that extend in a direction that is parallel to the word-line 102, multiple bit-lines that extend in a direction that is parallel to the bit-line 104, and multiple cells similar to cell 101 disposed at intersections of the bit-lines and word-lines.

The cell 101 is part of an electrical pathway between the word-line 102 and the bit-line 104. For example, current may be applied to the cell 101 during read/write operations using the word-line 102 and the bit-line 104. The cell 101 generally includes a phase change material such as a chalcogenide material (e.g., glass) that can be switched between crystalline and amorphous states with the application of heat produced by an electric current. The state (e.g., crystalline/amorphous) of the phase change material may correspond with a logical value (e.g., 1 or 0) of the cell 101.

In the depicted embodiment, the cell 101 includes a first structure 100a and a second structure 100b. In some embodiments, the first structure 100a includes a memory or storage element and the second structure 100b includes a switch element. In other embodiments, the first structure 100a includes a switch element and the second structure 100b includes a memory or storage element.

The first structure 100a includes a first switch or storage (SOS) structure 108, a first bottom electrode 106, and a first top electrode 110, coupled as can be seen. The second structure 100b includes a second SOS structure 114, a second bottom electrode 112, and a second top electrode 116, coupled as can be seen. That is, the first SOS structure 108 may be a switch element or a storage element and the second SOS structure 114 may be a switch element or a storage element. Generally, if the first SOS structure 108 is a storage element, then the second SOS structure 114 is a switch element and, if the second SOS structure 114 is a storage element, then the first SOS structure 108 is a switch element. In some embodiments, the first SOS structure 108 is a storage element that may be composed of a PCM material such as chalcogenide glass and the second SOS structure 114 is a switch element that may be composed of a chalcogenide alloy. In other embodiments, the first SOS structure 108 is a switch element that may be composed of a chalcogenide alloy and the second SOS structure 114 is a storage element that may be composed of a PCM material such as chalcogenide glass. The switch element may include, for example, a diode, an Ovonic Threshold Switch (OTS), a bipolar junction transistor (BJT), or metal-oxide-semiconductor field-effect transistor (MOSFET). Devices having memory cells with both a memory or storage element and a switch may be referred to as a phase change memory and switch (PCMS) device.

The electrodes 106, 110, 112 and 116 are composed of an electrically conductive material. For example, the electrodes 106, 110, 112 and 116 may include a metal such as tungsten, a cermet such as titanium nitride (TiN) or titanium silicon nitride (TiSiN), a doped semiconductor such as silicon (Si) or germanium (Ge), and/or a semi-metal such as carbon including amorphous and crystalline carbon. In various embodiments, materials for the electrodes 106, 110, 112 and 116 follow the Wiedemann-Franz constant.

Each of the electrodes 106, 110, 112 and 116 may be composed of a different or same material (e.g., same chemical composition). In some embodiments, the first top electrode 110 of the first structure 100a and the second bottom electrode 112 of the second structure 100b are composed of a same material and formed during a same deposition operation to provide a single electrode structure 111 between the first SOS structure 108 and the second SOS structure 114.

The electrodes 106, 110, 112 and 116 electrically couple the SOS structures 108, 114 to the word-line 102 and the bit-line 104. Heat may be generated in or adjacent to the SOS structures 108, 114 when a current is applied to the cell 101 through the word-line 102 and the bit-line 104. According to various embodiments, the first structure 100a and/or the second structure 100b includes a dielectric film (e.g., dielectric film 118 of FIGS. 2A-I) to increase thermal insulation of the SOS structures 108, 114 while still allowing an electrical current to flow through the cell 101. Various configurations of the dielectric film in the first structure 100a and/or the second structure 100b is depicted and described in connection with FIGS. 2A-I.

FIGS. 2A-I schematically illustrate some example configurations for portions (e.g., first structure 100a and/or second structure 100b) of a PCM device (e.g., the PCM device 100 of FIG. 1) including a dielectric film 118 in accordance with some embodiments. Referring to FIGS. 1 and 2A-I, the dielectric film 118 may increase thermal insulation in the cell 101 resulting in increased joule heating efficiency of the cell, which may reduce a programming current of the PCM device 100. The dielectric film 118 may include a variety of materials including polymers and ceramics, or combinations thereof.

In one embodiment, the dielectric film 118 includes a polymer. Polymers may be thermally insulative because free electrons are not available for conduction and weak secondary bonding (e.g., Van der Waals forces) between molecules of the polymer may make it difficult for phonons to move from one molecule to another. In some embodiments, the dielectric film 118 may include a low-k material such as, for example, polyimide, polynorbornene, benzocyclobutene, polytetrafluoroethylene, and/or epoxy-based photoresist (e.g., SU-8 2000 from Microchem), and the like, that can be spun-on to a substrate (e.g., a wafer) using a spin-on process. In other embodiments, the dielectric film 118 may include a silicone based material such as hydrogen silsesquioxane and/or methylsilsesquioxane, and the like, that can be spun-on to a substrate using a spin-on process.

In another embodiment, the dielectric film 118 includes a ceramic. Ceramics may be more thermally conductive than polymers as a result of ionic and covalent bonding, which facilitate propagation of phonons. Also, ceramics may have more mobile electrons or ions than polymers, which may increase thermal conduction relative to polymers. Ceramics may have a lower concentration of free electrons compared to a metal, which has free electrons. In some instances, ceramics may not have any free electrons. Free electrons generally increase thermal conductivity of a material. Thus, ceramics are more thermally insulative than metals, cermets, or other electrically conductive materials. In some embodiments, the dielectric film includes a ceramic such as, for example, silicon oxide ($SiO2$), titanium oxide ($TiO2$), magnesium oxide (MgO), aluminum oxide ($Al2O3$), tungsten oxide (WO), tantalum oxide ($Ta2O5$), and/or silicon nitride (SiN), and the like, including stoichiometric variations of these materials (e.g., $Si3N4$). The ceramic may be deposited using, for example, chemical vapor deposition (CVD), atomic layer deposition (ALD), physical vapor deposition (PVD), sputtering, or other suitable process.

According to various embodiments, the dielectric film 118 includes a thickness that allows electron transport by direct tunneling through the dielectric film 118. That is, the dielectric film 118 is part of an electrical pathway between the word-line 102 and the bit-line 104. In some embodiments, the dielectric film 118 is part of an electrical pathway between the word-line 102 or the bit-line 104 and the first SOS structure 108 or the second SOS structure 114.

In an embodiment where the dielectric film 118 includes a polymer, a thickness of the dielectric film 118 may be 2 nanometers or less. In an embodiment where the dielectric film 118 includes a ceramic, a thickness of the dielectric film 118 may be 1 nanometer or less. Other thicknesses may be used in other embodiments.

Figure 2A:
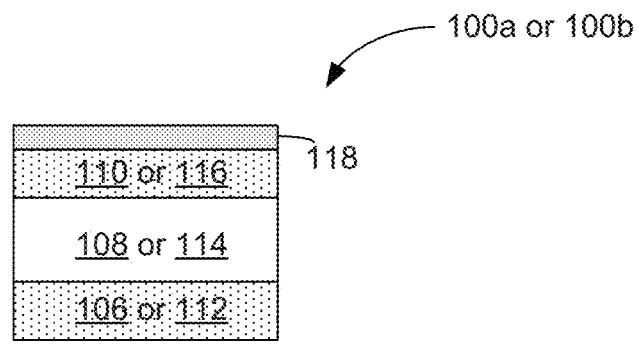
FIGS. 2A-I schematically illustrate some example configurations for portions of a PCM device including a dielectric film in accordance with some embodiments.

Referring to FIGS. 1 and 2A, the first structure 100a and/or the second structure 100b includes a dielectric film 118 directly coupled with the first top electrode 110 and/or the second top electrode 116. As can be seen in the depicted embodiment, a first surface of the top electrode 110 or 116 is directly coupled with the SOS structure 108 or 114 and the dielectric film 118 is directly coupled with a second surface of the top electrode 110 or 116, the second surface being disposed opposite to the first surface.

In an embodiment where the dielectric film 118 is part of the first structure 100a, the dielectric film 118 may be directly coupled with the second bottom electrode 112 of the second structure 100b of PCM device 100 or directly coupled with the second SOS structure 114 of PCM device 100 in a case where the single electrode structure 111 is used. In an embodiment where the dielectric film 118 is part of the second structure 100b, the dielectric film 118 may be directly coupled with the bit-line 104 of PCM device 100.

Figure 2B:
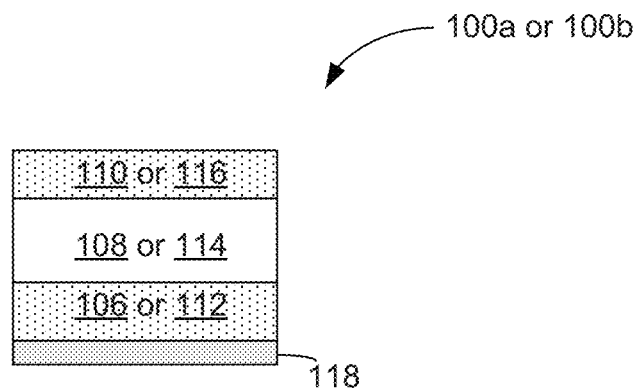

Referring to FIGS. 1 and 2B, the first structure 100a and/or the second structure 100b includes a dielectric film 118 directly coupled with the first bottom electrode 106 and/or the second bottom electrode 112. As can be seen in the depicted embodiment, a first surface of the bottom electrode 106 or 112 is directly coupled with the SOS structure 108 or 114 and the dielectric film 118 is directly coupled with a second surface of the bottom electrode 106 or 112, the second surface being disposed opposite to the first surface.

In an embodiment where the dielectric film 118 is part of the first structure 100a, the dielectric film 118 may be directly coupled with the word-line 102 of PCM device 100. In an embodiment where the dielectric film 118 is part of the second structure 100b, the dielectric film 118 may be directly coupled with the first top electrode 110 of PCM device 100 or directly coupled with the first SOS structure 108 of PCM device 100 in a case where the single electrode structure 111 is used.

Figure 2C:
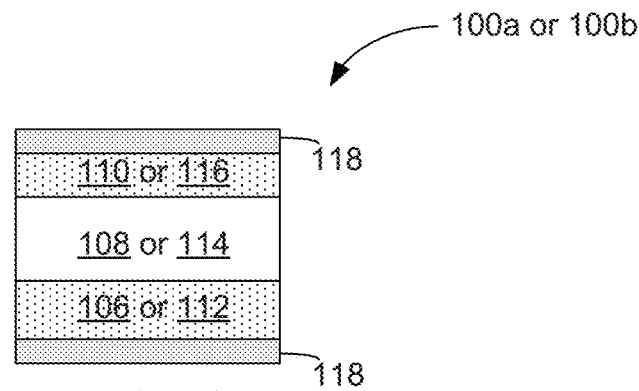

Referring to FIGS. 1 and 2C, the first structure 100a and/or the second structure 100b includes a dielectric film 118 directly coupled with the top electrode 110 or 116 and the bottom electrode 106 or 112. The dielectric film 118 of FIG. 2C may be coupled with components of the PCM device 100 of FIG. 1 according to embodiments described in connection with FIGS. 2A and 2B.

Figure 2D:
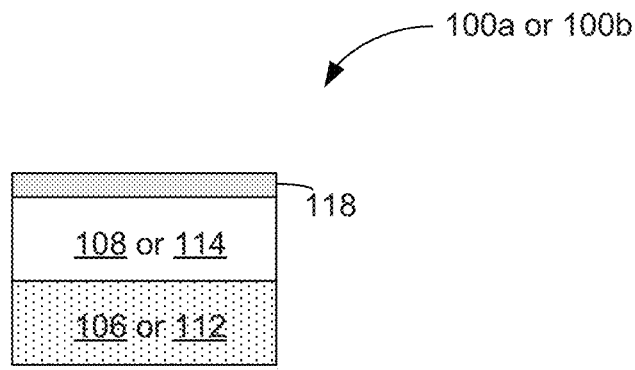

Referring to FIGS. 1 and 2D, the first structure 100a and/or the second structure 100b includes a dielectric film 118 directly coupled with a first surface of the SOS structure 108 or 114, as can be seen. The bottom electrode 106 or 112 may be directly coupled with a second surface of the SOS structure 108 or 114, the second surface being disposed opposite to the first surface.

In an embodiment where the dielectric film 118 is part of the first structure 100a, the dielectric film 118 may be directly coupled with the second bottom electrode 112 of PCM device 100. In an embodiment where the dielectric film 118 is part of the second structure 100b, the dielectric film 118 may be directly coupled with the bit-line 104 of PCM device 100.

Figure 2E:
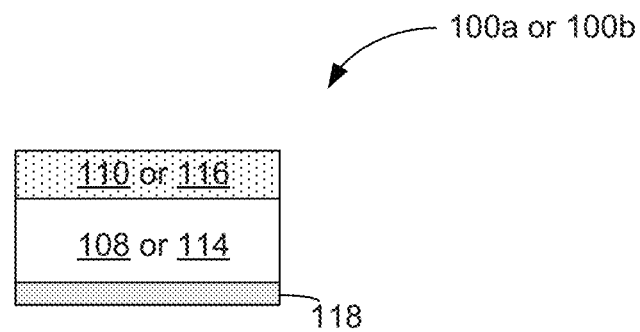

Referring to FIGS. 1 and 2E, the first structure 100a and/or the second structure 100b includes a dielectric film 118 directly coupled with a surface of the SOS structure 108 or 114, as can be seen. The top electrode 110 or 116 may be directly coupled with an opposite surface of the SOS structure 108 or 114.

In an embodiment where the dielectric film 118 is part of the first structure 100a, the dielectric film 118 may be directly coupled with the word-line 102 of PCM device 100. In an embodiment where the dielectric film 118 is part of the second structure 100b, the dielectric film 118 may be directly coupled with the first top electrode 110 of PCM device 100.

Figure 2F:
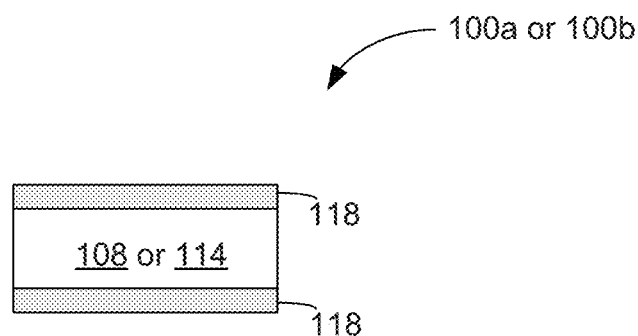

Referring to FIGS. 1 and 2F, the first structure 100a and/or the second structure 100b includes a dielectric film 118 directly coupled with opposite surfaces of the SOS structure 108 or 114, as can be seen. In an embodiment where the dielectric film 118 is part of the first structure 100a, the dielectric film 118 on the bottom of the first SOS structure 108 may be directly coupled with word-line 102 of PCM device 100 the dielectric film 118 on the top of the first SOS structure 108 may be directly coupled with the second bottom electrode 112 of PCM device 100. In an embodiment, where the dielectric film 118 is part of the second structure 100b, the dielectric film 118 on the bottom of the first SOS structure 108 may be directly coupled with first top electrode 110 of PCM device 100 and the dielectric film 118 on the top of the first SOS structure 108 may be directly coupled with the bit-line 104.

Figure 2G:
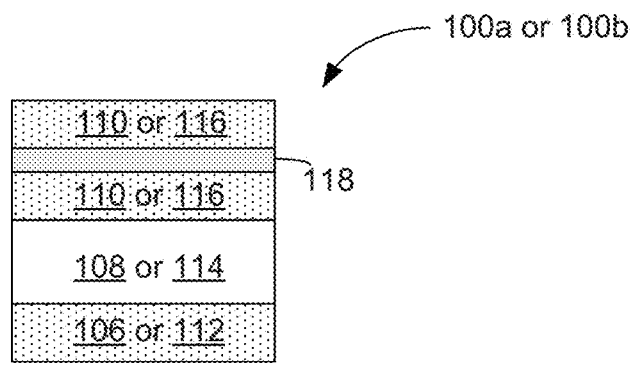

Referring to FIGS. 1 and 2G, the first structure 100a and/or the second structure 100b includes a dielectric film 118 directly coupled with the top electrode 110 or 116. The dielectric film 118 is disposed between a portion of the top electrode 110 or 116 and another portion of the top electrode 110 or 116, as can be seen. In one embodiment, after an electrically conductive material is deposited on the SOS structure 108 or 114 to form the top electrode 110 or 116, a dielectric material is deposited to form the dielectric film 118. Subsequent to depositing the dielectric film 118, electrically conductive material may be deposited on the dielectric film 118 to encapsulate the dielectric film 118 within the top electrode 110 or 116.

In an embodiment where the dielectric film 118 is part of the first structure 100a, the first bottom electrode 106 may be directly coupled with the word-line 102 of PCM device 100 and the first top electrode 110 may be directly coupled with the second bottom electrode 112 of PCM device 100. In an embodiment where the dielectric film 118 is part of the second structure 100b, the second bottom electrode 112 may be directly coupled with the first top electrode 110 of PCM device 100 and the second top electrode 116 may be directly coupled with the bit-line 104 of PCM device 100.

Figure 2H:
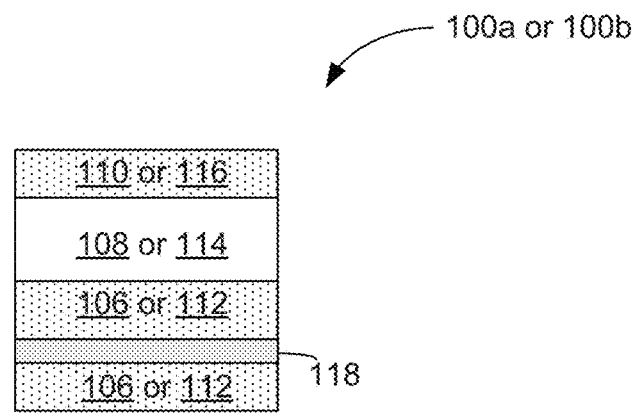

Referring to FIGS. 1 and 2H, the first structure 100a and/or the second structure 100b includes a dielectric film 118 directly coupled with the bottom electrode 106 or 112. The dielectric film 118 is disposed between a portion of the bottom electrode 106 or 112 and another portion of the bottom electrode 106 or 112, as can be seen.

In an embodiment where the dielectric film 118 is part of the first structure 100a, the first bottom electrode 106 or 112 may be directly coupled with the word-line 102 of PCM device 100 and the first top electrode 110 may be directly coupled with the second bottom electrode 112 of PCM device 100. In an embodiment where the dielectric film 118 is part of the second structure 100b, the second bottom electrode 112 may be directly coupled with the first top electrode 110 of PCM device 100 and the second top electrode 116 may be directly coupled with the bit-line 104 of PCM device 100.

Figure 2I:
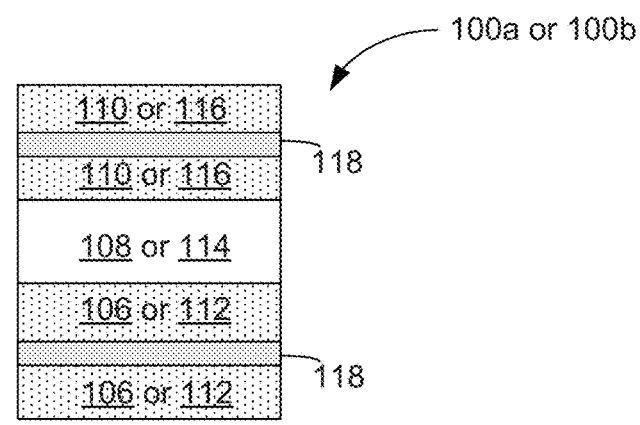

Referring to FIGS. 1 and 2I, the first structure 100a and/or the second structure 100b includes a dielectric film 118 disposed within the bottom electrode 106 or 112 and the top electrode 110 or 116, as can be seen. The configuration depicted in FIG. 2I may comport with embodiments described in connection with FIGS. 2G and 2H.

In some embodiments, any suitable combination of the configurations depicted in FIGS. 2A-I can be used in the PCM device 100 of FIG. 1. For example, more than two dielectric films may be used in the first structure 100a or the second structure 100b. For another example, an electrode may be formed such that the electrode is directly coupled with the dielectric film 118 of FIGS. 2D-F. Other combinations may fall within the scope of the present disclosure.

Figure 3:
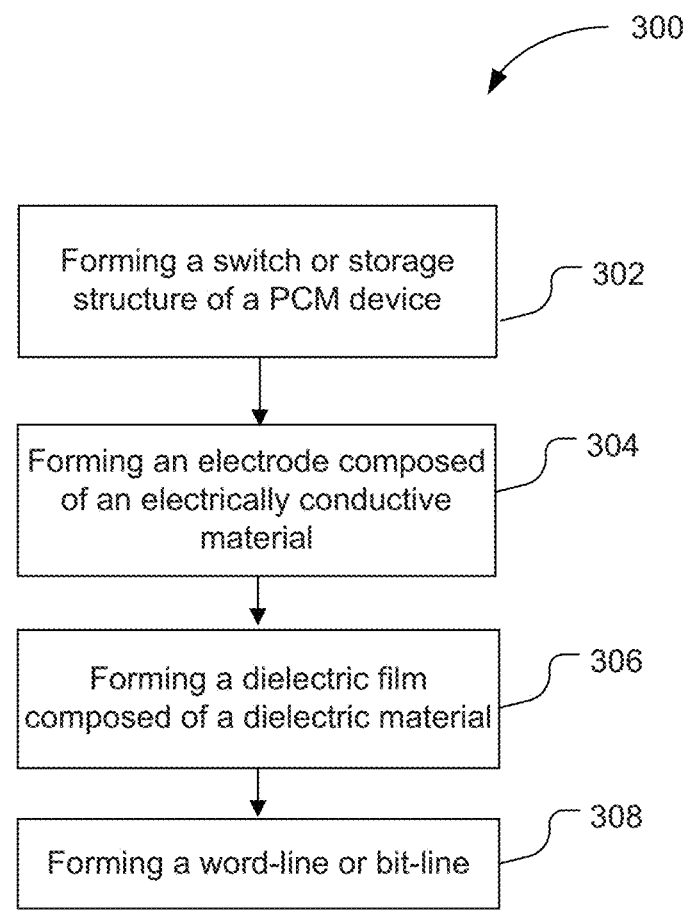
FIG. 3 is a flow diagram for a method of fabricating a portion of a PCM device in accordance with some embodiments.

FIG. 3 is a flow diagram for a method 300 of fabricating a portion of a PCM device (e.g., the PCM device 100 of FIG. 1) in accordance with some embodiments. The method 300 includes forming a SOS structure (e.g., the SOS structure 108 or 114 of FIG. 1) of a PCM device at 302, forming an electrode (e.g., the electrode 106, 110, 112, or 116 of FIG. 1) composed of an electrically conductive material at 304, forming a dielectric film (e.g., the dielectric film 118 of FIGS. 2A-I) composed of a dielectric material at 306, and forming a word-line (e.g., the word-line 102 of FIG. 1) or bit-line at 308 (e.g., the bit-line 104 of FIG. 1).

The SOS structure may be formed at 302 using any suitable process including deposition processes to deposit a PCM material (e.g., chalcogenide glass) and patterning processes such as etch and/or lithography to define the SOS structure. The electrode may be formed at 304 using any suitable process including deposition processes to deposit an electrically conductive material and a patterning process such as etch and/or lithography to define the electrode. A patterning process that defines the electrode may be a shared operation with a patterning process used to define the SOS structure in some embodiments.

The dielectric film may be formed at 306 using any suitable process including deposition processes such as spin-on processes for polymer materials and/or CVD, ALD, PVD, or sputtering processes for ceramic materials. Patterning processes such as etch/lithography may be used to thin or otherwise define the dielectric film. In some embodiments, a patterning process that defines the electrode and/or the SOS structure may be a shared operation with a patterning process that defines the dielectric film.

The word-line or bit-line may be formed at 308 using any suitable process including deposition processes to deposit an electrically conductive material and patterning processes such as etch and/or lithography to define the word-line or bit-line. The operations of method 300 may not be performed in the order of presentation. Operations described may be performed in a different order than the described embodiment. Various additional operations may be performed and/or described operations may be omitted in additional embodiments.

In one embodiment, a method of fabricating the PCM device 100 of FIG. 1 includes forming a word-line (e.g., the word-line 102 of FIG. 1), forming an electrode (e.g., the first bottom electrode 106 of FIG. 1) on the word-line, forming a SOS structure (e.g., the first SOS structure 108 of FIG. 1) on the electrode, forming another electrode (e.g., the first top electrode 110 of FIG. 1) on the SOS structure, forming yet another electrode (e.g., the second bottom electrode 112 of FIG. 1) on the another electrode, forming another SOS structure (e.g., the second SOS structure 114 of FIG. 1) on the yet another electrode, forming still yet another electrode (e.g., the second top electrode 116 of FIG. 1) on the another SOS structure, and forming a bit-line (e.g., the bit-line 104 of FIG. 1) on the still yet another electrode. The method further includes forming at least one dielectric film between at least two of the above operations. For example, the dielectric film can be deposited to form a PCM device that comports with any of the configurations described in connection with FIGS. 2A-I.

An article of manufacture is disclosed. In some embodiments, the article of manufacture includes non-transitory storage such as, for example, the non-volatile memory (NVM)/storage 416 of FIG. 4. The article of manufacture may have instructions stored thereon, that if executed by a processor, cause the actions of method 300 of FIG. 3 or other techniques disclosed herein to be performed.

Embodiments of the present disclosure may be implemented into a system using any suitable hardware and/or software to configure as desired.

Figure 4:
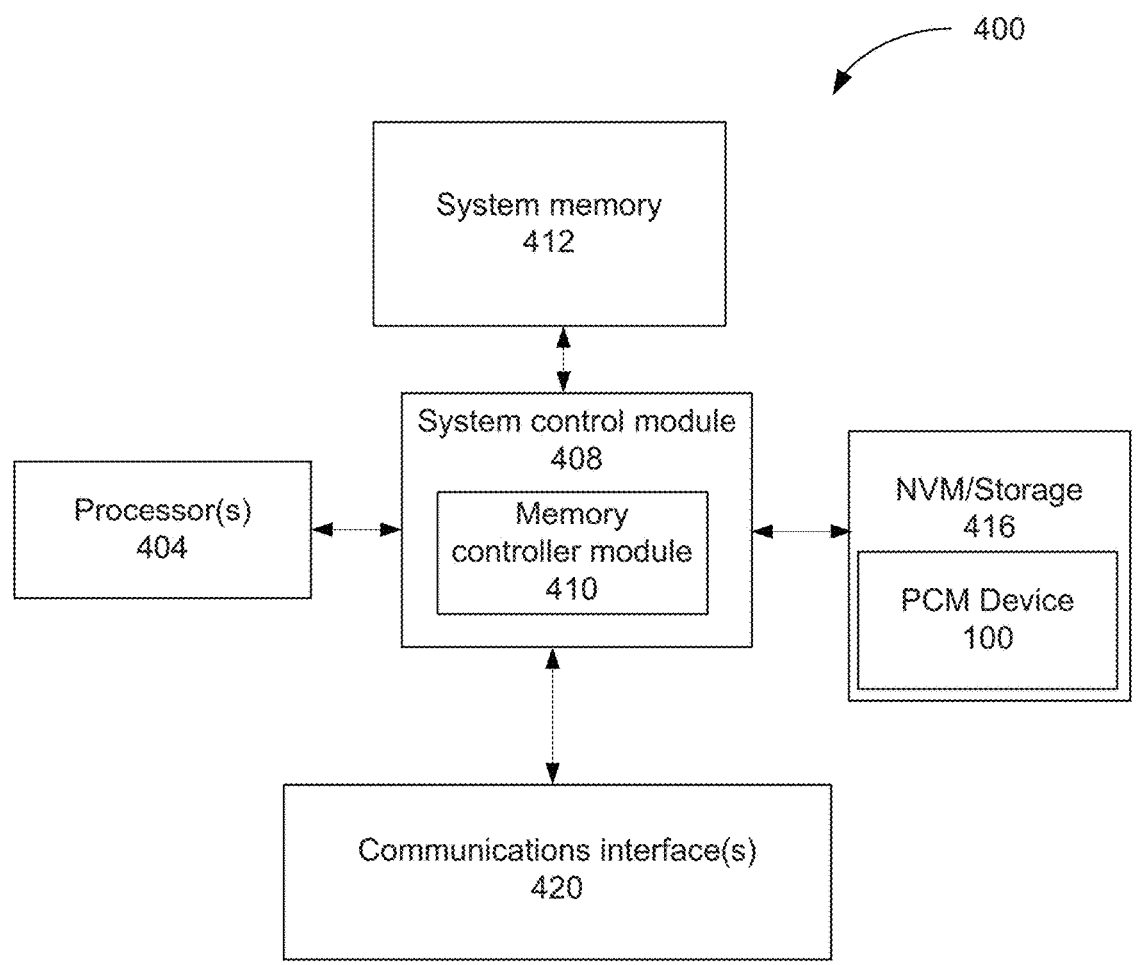
FIG. 4 schematically illustrates an example system that may include a PCM device described herein in accordance with some embodiments.

FIG. 4 schematically illustrates an example system that may include a PCM device described herein in accordance with some embodiments. In one embodiment, the system 400 includes one or more processor(s) 404, system control module 408 coupled with at least one of the processor(s) 404, system memory 412 coupled with system control module 408, non-volatile memory (NVM)/storage 416 coupled with system control module 408, and one or more communications interface(s) 420 coupled with system control module 408.

System control module 408 for one embodiment may include any suitable interface controllers to provide for any suitable interface to at least one of the processor(s) 404 and/or to any suitable device or component in communication with system control module 408.

System control module 408 may include a memory controller module 410 to provide an interface to system memory 412. The memory controller module 410 may be a hardware module, a software module, and/or a firmware module.

System memory 412 may be used to load and store data and/or instructions, for example, for system 400. System memory 412 for one embodiment may include any suitable volatile memory, such as suitable DRAM, for example.

System control module 408 for one embodiment may include one or more input/output (I/O) controller(s) to provide an interface to NVM/storage 416 and communications interface(s) 420.

The NVM/storage 416 may be used to store data and/or instructions, for example. NVM/storage 416 may include any suitable non-volatile memory, such as PCM or flash memory, for example, and/or may include any suitable non-volatile storage device(s), such as one or more hard disk drive(s) (HDD(s)), one or more compact disc (CD) drive(s), and/or one or more digital versatile disc (DVD) drive(s) for example. According to various embodiments, the NVM/storage 416 includes a PCM device 100 as described herein.

The NVM/storage 416 may include a storage resource physically part of a device on which the system 400 is installed or it may be accessible by, but not necessarily a part of, the device. For example, the NVM/storage 416 may be accessed over a network via the communications interface(s) 420.

Communications interface(s) 420 may provide an interface for system 400 to communicate over one or more wired or wireless network(s) and/or with any other suitable device.

For one embodiment, at least one of the processor(s) 404 may be packaged together with logic for one or more controller(s) of system control module 408, e.g., memory controller module 410. For one embodiment, at least one of the processor(s) 404 may be packaged together with logic for one or more controllers of system control module 408 to form a System in Package (SiP). For one embodiment, at least one of the processor(s) 404 may be integrated on the same die with logic for one or more controller(s) of system control module 408. For one embodiment, at least one of the processor(s) 404 may be integrated on the same die with logic for one or more controller(s) of system control module 408 to form a System on Chip (SoC).

In various embodiments, the system 400 may be, but is not limited to, a server, a workstation, a desktop computing device, or a mobile computing device (e.g., a laptop computing device, a handheld computing device, a handset, a tablet, a smartphone, a netbook, etc.). In various embodiments, the system 400 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method comprising:
    forming a storage structure of a phase change memory (PCM) device, the storage structure having a chalcogenide material;
    forming an electrode having an electrically conductive material, the electrode having a first surface that is directly coupled with the storage structure; and
    forming a dielectric film having a single layer of a dielectric material with a thickness of less than 0.7 nanometers, the dielectric film being directly coupled with a second surface of the electrode that is disposed opposite to the first surface, the dielectric film including a ceramic.

2. The method of claim 1, wherein the electrode is a first electrode having a first electrically conductive material and the storage structure includes a first surface that is directly coupled with the first electrode, the method further comprising:
    forming a second electrode having a second electrically conductive material, the second electrode being directly coupled with a second surface of the storage structure that is disposed opposite the first surface of the storage structure.

3. The method of claim 2, further comprising:
    forming a third electrode having a third electrically conductive material, the third electrode being directly coupled with the dielectric film such that the dielectric film is disposed between the first electrode and the third electrode.

4. The method of claim 1, wherein the dielectric film is a first dielectric film having a first dielectric material and the storage structure includes a first surface that is directly coupled with the first electrode, the method further comprising:
    forming a second dielectric film having a second dielectric material, the second dielectric film being directly coupled with a second surface of the storage structure that is disposed opposite to the first surface of the storage structure.

5. The method of claim 1, wherein forming the dielectric film comprises:
    depositing a ceramic or a polymer to form the dielectric film.

6. The method of claim 1, further comprising:
    forming a word-line or a bit-line, wherein the electrode is an intervening structure between the storage structure and the word-line or the bit-line and the dielectric film is part of an electrical pathway between the word-line or the bit-line and the storage structure.

7. The method of claim 1, wherein the PCM device is a phase change memory and switch (PCMS) device, and the storage structure is a storage element of the PCMS device.

8. The method of claim 1, wherein the ceramic is selected from a group consisting of titanium oxide ($TiO_2$), magnesium oxide (MgO), tungsten oxide (WO), and tantalum oxide ($Ta_2O_5$).

* * * * *